(12) United States Patent
Wahler

(10) Patent No.: US 9,123,187 B2
(45) Date of Patent: Sep. 1, 2015

(54) VEHICLE DATA RECORDING DEVICE

(71) Applicant: Continental Automotive GmbH, Hannover (DE)

(72) Inventor: Torsten Wahler, Bad Duerheim (DE)

(73) Assignee: Continental Automotive GmbH, Hannover (DE)

( * ) Notice: Subject to any disclaimer, the term of this patent is extended or adjusted under 35 U.S.C. 154(b) by 349 days.

(21) Appl. No.: 13/687,447

(22) Filed: Nov. 28, 2012

(65) Prior Publication Data

US 2013/0127315 A1 May 23, 2013

Related U.S. Application Data

(63) Continuation-in-part of application No. 13/190,855, filed on Jul. 26, 2011, now abandoned.

(30) Foreign Application Priority Data

Jun. 1, 2011 (DE) .................. 20 2011 101 626 U
Mar. 16, 2012 (DE) .................. 10 2012 204 204

(51) Int. Cl.
| | | |
|---|---|---|
| A47G 29/00 | (2006.01) | |
| G07C 5/06 | (2006.01) | |
| B41J 29/13 | (2006.01) | |
| G07C 5/02 | (2006.01) | |
| B60R 11/00 | (2006.01) | |
| H05K 5/02 | (2006.01) | |
| G07C 5/08 | (2006.01) | |

(52) U.S. Cl.
CPC . *G07C 5/06* (2013.01); *B41J 29/13* (2013.01); *B60R 11/00* (2013.01); *G07C 5/02* (2013.01); *H05K 5/0217* (2013.01); *B60R 2011/0052* (2013.01); *B60R 2011/0085* (2013.01); *G07C 5/0841* (2013.01)

(58) Field of Classification Search
CPC .. B41J 29/13; B60R 11/00; B60R 2011/0052; B60R 2011/0085; B60R 11/02; G07C 5/06; G07C 5/0841
USPC ............ 248/292.12, 673, 677, 688, 917, 923; 224/929; 312/7.1
See application file for complete search history.

(56) References Cited

U.S. PATENT DOCUMENTS 2,966,257 A * 12/1960 Littlejohn ...................... 312/244
3,124,266 A * 3/1964 Morgan ....................... 220/4.02

(Continued)

FOREIGN PATENT DOCUMENTS

| DE | 37 23 723 A1 | 1/1988 |
|---|---|---|
| DE | 10 2006 023 984 A1 | 11/2007 |

*Primary Examiner* — Gwendolyn W Baxter
(74) *Attorney, Agent, or Firm* — Cozen O'Connor

(57) ABSTRACT

A vehicle data recording device wherein the housing is connected to a first supporting limb and a second supporting limb of the supporting bracket in such a way that it can pivot about a pivoting axis, wherein the pivoting axis is arranged above a housing central axis with respect to the height of the housing, and wherein the smallest distance between the pivoting axis and a mounting plate, connecting the supporting limb, of the supporting bracket is larger than the largest distance between the pivoting axis and a rear-side housing wall of the housing, with the result that the supporting bracket can be pivoted through an angle of 180° over a housing rear side, between a first position in a region underneath a housing lower side and a second position in a region above the housing upper side.

15 Claims, 4 Drawing Sheets

(56) References Cited

U.S. PATENT DOCUMENTS

| | | |
|---|---|---|
| 3,410,122 A | 11/1968 | Moses |
| 4,085,369 A | 4/1978 | Burke |
| 4,170,324 A | 10/1979 | Stubbings |
| 4,196,821 A | 4/1980 | Teti, Jr. et al. |
| 4,436,351 A * | 3/1984 | Kitrell .......................... 312/7.1 |
| 4,829,595 A | 5/1989 | Kobayashi et al. |
| 5,303,163 A | 4/1994 | Ebaugh et al. |
| 6,113,047 A | 9/2000 | Wung et al. |
| 7,770,858 B2 * | 8/2010 | Fehrenbach et al. ....... 248/291.1 |
| 2009/0122128 A1 | 5/2009 | Hug et al. |

\* cited by examiner

VEHICLE DATA RECORDING DEVICE

CROSS REFERENCE TO RELATED APPLICATION

This is a Continuation-in-Part application of Ser. No. 13/190,855 filed Jul. 26, 2011. Priority is claimed based on German Applications No. 20 2011 101 626.2 filed Jun. 1, 2011; No. 10 2012 204 204.0 filed Mar. 16, 2012 the contents of which is incorporated herein in its entirety by reference.

BACKGROUND OF THE INVENTION

1. Field of the invention

The invention relates to a vehicle data recording device having a housing that can be mounted in a motor vehicle.

2. Detailed Description of Prior Art

Vehicle data recording devices are, for example, tachographs. A vehicle data recording device can be embodied as an installation device installed, for example, in a dashboard or a cockpit of a motor vehicle and in which all the operator control elements and display elements as well as possibly necessary device openings, for example a refilling opening for printing material for a printing device or a chip card insertion opening are arranged on a housing front side.

A disadvantage of such a vehicle data recording device is that for its installation it is generally necessary to provide a specific installation space, usually referred to as an installation shaft, in the dashboard or the cockpit of the motor vehicle. As a result, the vehicle data recording device cannot always be installed in a flexible way and cannot always be retrofitted. Furthermore it may be the case that an installation shaft present in the motor vehicle is already occupied by another device and is no longer available for the installation of the vehicle data recording device.

SUMMARY OF THE INVENTION

An object of the invention is to provide a vehicle data recording device of the type mentioned at the beginning that can be easily attached in a motor vehicle independently of an installation shaft.

According to one embodiment of the invention a vehicle data recording device with a housing, having a housing front side that faces a user and has an operator control element, a housing upper side having an access to a printing material receptacle of a printing device, and a U-shaped supporting bracket for mounting the housing in a motor vehicle. The housing is connected to a first supporting limb and a second supporting limb of the supporting bracket in such a way that it can pivot about a pivoting axis. The pivoting axis is arranged above a housing central axis with respect to the height of the housing. A smallest distance between the pivoting axis and a mounting plate connecting the supporting limb of the supporting bracket is larger than the largest distance between the pivoting axis and a rear-side housing wall of the housing, with the result that the supporting bracket can be pivoted through an angle of 180° over a housing rear side, between a first position in a region underneath a housing lower side and a second position in a region above the housing upper side.

The motor vehicle is preferably a commercial vehicle, in particular a utility vehicle or a truck or a bus. In the vehicle data recording device according to one embodiment of the invention it is particularly advantageous that it can be operated very satisfactorily not only by the operator control element on the housing front side and the printing material receptacle on the housing upper side, but it can, in particular, also be attached in a motor vehicle in a flexible way; this is because depending on the pivoting position of the supporting bracket the vehicle data recording device can either be installed as an add-on unit on, for example, a dashboard of the motor vehicle or else can be mounted in a suspended way as a suspension unit under, for example, the roof of a driver's cab of the motor vehicle, or as an attachment unit, to be more precise a front-mounted attachment unit, for example attached to a center console or a cockpit of the motor vehicle, without its operator control capability, including the accessibility to the printing material receptacle, being adversely affected. By virtue of the fact that the pivoting axis is arranged above the housing central axis, as a result of which when the device is suspended a large free space in the upward direction and therefore good accessibility to the printing material receptacle, occur, and when the device is mounted a forced arrangement occurs, which in particular does not also unnecessarily restrict a driver's view of the motor vehicle. The vehicle data recording device according to the invention can therefore be advantageously attached in a very variable fashion in a motor vehicle, in particular in a passenger compartment or a driver's cab of the motor vehicle, since it can be mounted, for example, both on horizontal faces and on perpendicular or steeply dropping-away faces as well as overhead, wherein the printing material receptacle is accessible in every mounting position.

By virtue of the inventive possibility of pivotability of the supporting bracket from the underside to the upper side of the housing, the vehicle data recording device can be mounted on a planar face with virtually any desired inclination in the motor vehicle. Within a customary tolerance range, the supporting bracket can also be pivotable through an angle that deviates from 180° by a certain degree. Basically, the supporting bracket can also be pivotable over an angle of significantly more than 180°. For the sake of easy manufacturability, the housing can preferably be a plastic component, usually in multiple parts. For the sake of a high level of stability of the mounting of the housing in the motor vehicle, the supporting bracket can preferably be a metal component or can advantageously be formed from a composite-fiber plastic material which has glass fibers.

According to one embodiment of the invention, the distance between a plate central axis that intersects perpendicularly a mounting face of the mounting plate, and the pivoting axis is larger than zero. In this way, the arrangement of the vehicle data recording device in the motor vehicle can be simplified further. Furthermore, in this way it is also possible to ensure good accessibility to a housing interface arranged laterally on the housing, for example for an external data memory. The abovementioned distance between the plate central axis and the pivoting axis can preferably be approximately as large as the width of the mounting plate in the transverse direction with respect to the pivoting axis.

It is conceivable to provide the supporting limbs with, for example, a bend that points laterally away from the housing. On the other hand, it is particularly advantageous if, according to another development of the invention, the supporting limbs are of planar design and are connected to the mounting plate at an angle of 90°, if the first supporting limb has, in its supporting limb plane, a bent portion starting from the pivoting axis in the direction of the mounting plate, and if the second supporting limb has a bent portion that corresponds to the bent portion of the first supporting limb, with the result that the supporting limbs run in parallel. As a result, a very narrow, space-saving vehicle data recording device is obtained which can additionally have, in a front region, relatively close to the operator, of a lateral housing wall of the housing, a free space for, for example, a device interface. The device interface is preferably an interface for connecting an external data memory; in particular the device interface can be a USB (Universal Serial Bus) interface for connecting a USB flash memory, also referred to by the designation USB memory stick. By virtue of the bent portion, the supporting limbs have a bent or curved shape.

It will be possible to imagine that the housing is, for example, clipped or bonded to the supporting limbs. On the other hand, it is particularly advantageous if, according to another development of the invention, the housing is respectively connected by a screwed connection to the first supporting limb and to the second supporting limb. In this way, not only a secure connection between the housing and the supporting bracket is ensured but in addition by adapting the pivoting angle of the supporting bracket with respect to the housing there is also the possibility of a particularly user-friendly arrangement of the vehicle data recording device in the motor vehicle, with the result that both the operator control element of the housing front side and the printing material receptacle of the printing device are particularly easily accessible. The two screwed connections preferably secure the pivoting axis.

A cost-effective design of the screwed connection and easy dismounting of the housing from the supporting bracket, for example for repair purposes, are advantageously achieved if, according to one development of the invention, the supporting limbs have cutouts in the region of the screwed connections, and if the supporting limbs are respectively screwed to the housing by a screw-in element.

It is basically conceivable that the screwed connections have, for example, a loose screw nut. However, the assembly of the vehicle data recording device is significantly simplified if, according to another advantageous development of the invention, the housing has in each case a screw nut element in the region of the screwed connections. The screw nut elements can be formed in lateral housing walls of the housing; for this purpose, for example, a thread can be integrally formed onto a housing wall which is embodied as a plastic component. The screw nut elements are, however, preferably each pressed in as a press-in nut from the inside into a lateral housing wall of the housing. The press-in nuts are preferably embodied in such a way that when screw-in elements are tightened the press-in nuts cannot rotate or be pulled out.

An angular position provided between the housing and supporting limbs could, for example, be maintained solely by using a friction force or clamping force between the housing and supporting limbs. In order to improve the stability and maintain the position, another advantageous development of the invention provides that the housing has, on its outer side, housing latching elements arranged radially around the pivoting axis. The housing latching elements can not only advantageously contribute to increasing the friction force and clamping force but they also lead to positively locking engagement between the housing and supporting bracket.

It is basically already advantageous if the housing latching elements are provided only on one housing side. However, the stability is advantageously additionally improved if, according to one development of the invention, the housing is screwed to both supporting limbs, and if the housing has the housing latching elements on both screwed connections to the supporting limbs.

The stability and maintenance of the position of the connection of the housing and supporting bracket can advantageously also be increased further by virtue of the fact that, according to another development of the invention, at least one supporting limb has, on its limb surface facing the housing, supporting limb latching elements arranged radially around the pivoting axis.

It is particularly advantageous for a connection of the supporting bracket and housing which is continuously reliable and stable in terms of angle if, according to one development of the invention, the supporting limb latching elements correspond to housing latching elements on the outside of the housing, with the result that the supporting limb latching elements and the corresponding housing latching elements engage one in the other. These housing latching elements can correspond to the housing latching elements which are described further above, but they can also be embodied in a different way: for example it is conceivable that the housing latching elements are embodied in the form of nonoriented knobs on the outside of the housing. It is particularly advantageous if a large number of latching possibilities is provided so that fine angular resolution with respect to an orientation of the housing in the motor vehicle is obtained.

According to another advantageous development of the invention, the mounting plate has, in its mounting face, a plurality of mounting cutouts, wherein the mounting cutouts are arranged in at least two parallel rows. This permits particularly simple mounting in a wide variety of motor vehicles.

According to another advantageous development of the invention, the mounting plate has, in its mounting face, a cutout for a cable feedthrough. In particular, a connecting cable for the vehicle data recording device can be laid through this cutout in a secure and guided fashion and in addition an opening which is necessary, under certain circumstances, for leading through the connecting cable, in a passenger compartment trim of the motor vehicle, for example in a dashboard or in what is referred to as the inner roof lining, can be covered. The cutout can preferably be embodied in a circular shape in the mounting plate.

The operator control element of the housing front side could, for example, have a simple pushbutton switch or a rotary switch. However, it is particularly advantageous if, according to another development of the invention, the operator control element of the housing front side has a touch-sensitive screen. In this way, not only are particularly varied operator control inputs into the vehicle data recording device by the user made possible but information can also be output to the user with the operator control element.

It is conceivable that the supporting bracket is designed for a particularly high level of stability as a metal component. However, the manufacturing costs of the vehicle data recording device can be advantageously reduced if, according to another development of the invention, the supporting bracket is formed from a plastic material. For example, a polyamide (PA) is suitable as a plastic material for the supporting bracket. A supporting bracket which is formed from a plastic material is also particularly advantageous when the vehicle data recording device has, for the purpose of external communication, a transmitter and/or receiver for radio signals; with a supporting bracket which is formed from a plastic material it is advantageously possible to avoid unfavorable influencing or even screening of the transmission signals and/or reception signals of the transmitter or receiver. For example, the specified advantage can be useful if the radio signals are GPS (Global Positioning System) signals and the vehicle data recording device has a device for receiving GPS signals. Another example in which the specified advantage can be useful is the reception and transmission operations of a GSM (Global System for Mobile Communications) antenna when the vehicle data recording device has a GSM unit with a GSM antenna. According to one advantageous development of the invention there is provision that the plastic material is a composite fiber material and has glass fibers. This significantly increases the stability of the supporting bracket. The proportion of the glass fibers in the composite fiber material may preferably be 30 to 50 volume percent.

BRIEF DESCRIPTION OF THE DRAWINGS

Exemplary embodiments of the invention are illustrated in the drawing and will be described in more detail below. In said drawing, in a schematic, sketch-like illustration.

Corresponding elements are respectively provided with the same reference symbols in all the figures.

DETAILED DESCRIPTION OF THE PREFERRED EMBODIMENTS

Figure 1:
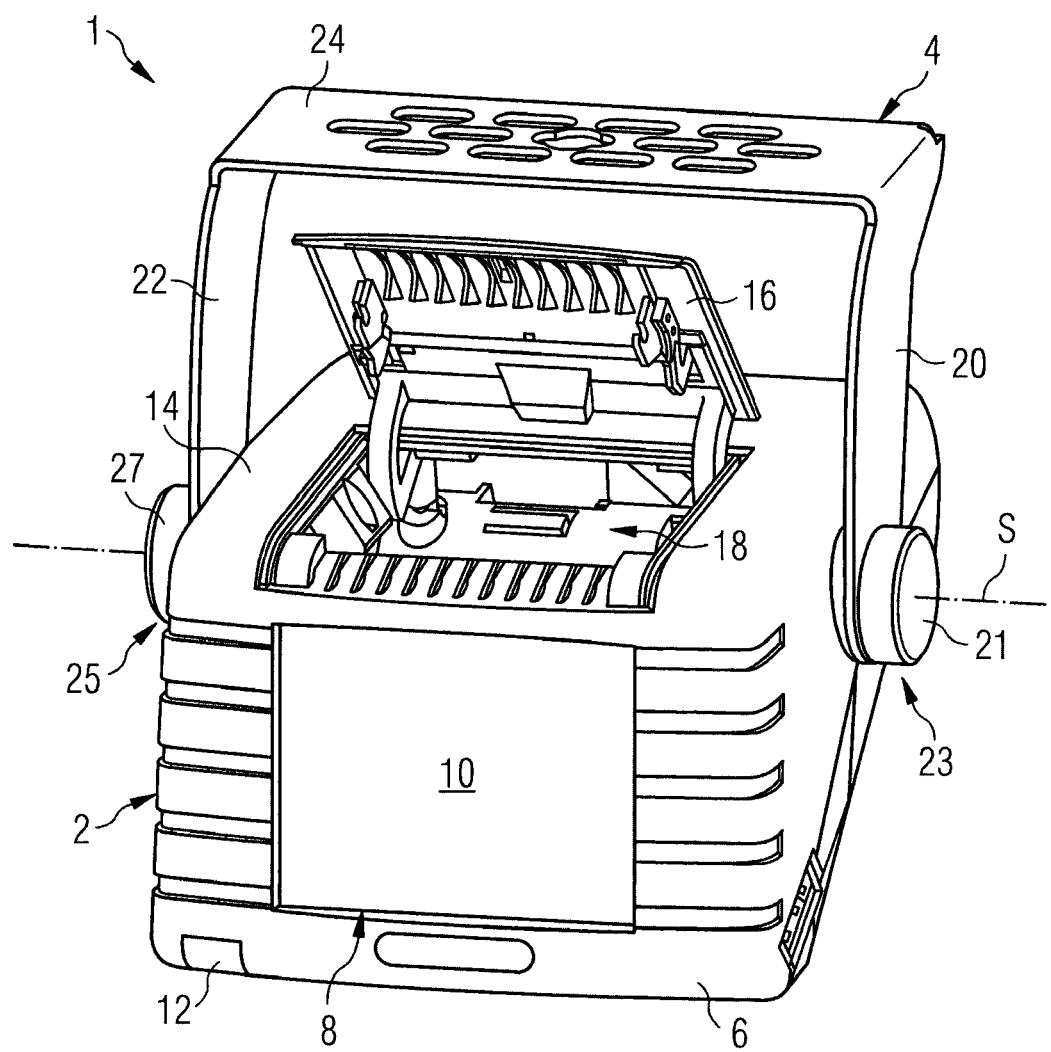
FIG. 1 is a perspective view, of a vehicle data recording device.

FIG. 1 shows a vehicle data recording device 1 with a housing and a U-shaped supporting bracket 4 for mounting the housing 2 in a motor vehicle. The housing 2 has a housing front side 6 facing a user, in particular a driver of the motor vehicle, with an operator control element 8 which has here a touch-sensitive screen 10; another term for the touch-sensitive screen 10 is touchscreen.

In addition, a further operator control element 12 which is embodied as an on/off switch for the vehicle data recording device 1 is provided on the housing front side 6.

A housing upper side 14 of the housing 2 has an access which can be closed, by a cover 16, here in a folding cover, to a printing material receptacle 18 of a printing device, arranged in the housing 2, of the vehicle data recording device 1. The printing device can be, for example, a thermoprinting device and the printing material can be printing paper rolled onto a wound web.

The supporting bracket 4, which is embodied as a metal component in this exemplary embodiment, has a first supporting limb 20, a second supporting limb 22 and a mounting plate 24 which connects the supporting limbs 20, 22. Alternatively, in this exemplary embodiment the supporting bracket 4 may be formed from a plastic material, which plastic material is, for example, a composite fiber material and has glass fibers for increasing the stability, instead of as a metal component. The housing 2 is arranged between the supporting limbs 20, 22, and the housing 2 is connected to the first supporting limb 20 and the second supporting limb 22 in such a way that it can pivot about a pivoting axis S. In this context, the housing 2 is respectively connected to the first supporting limb 20 and the second supporting limb 22 by a screwed connection 23, 25, wherein the supporting limbs 20, 22 are respectively screwed to the housing 2 by a screw-in element 21, 27.

Figure 2:
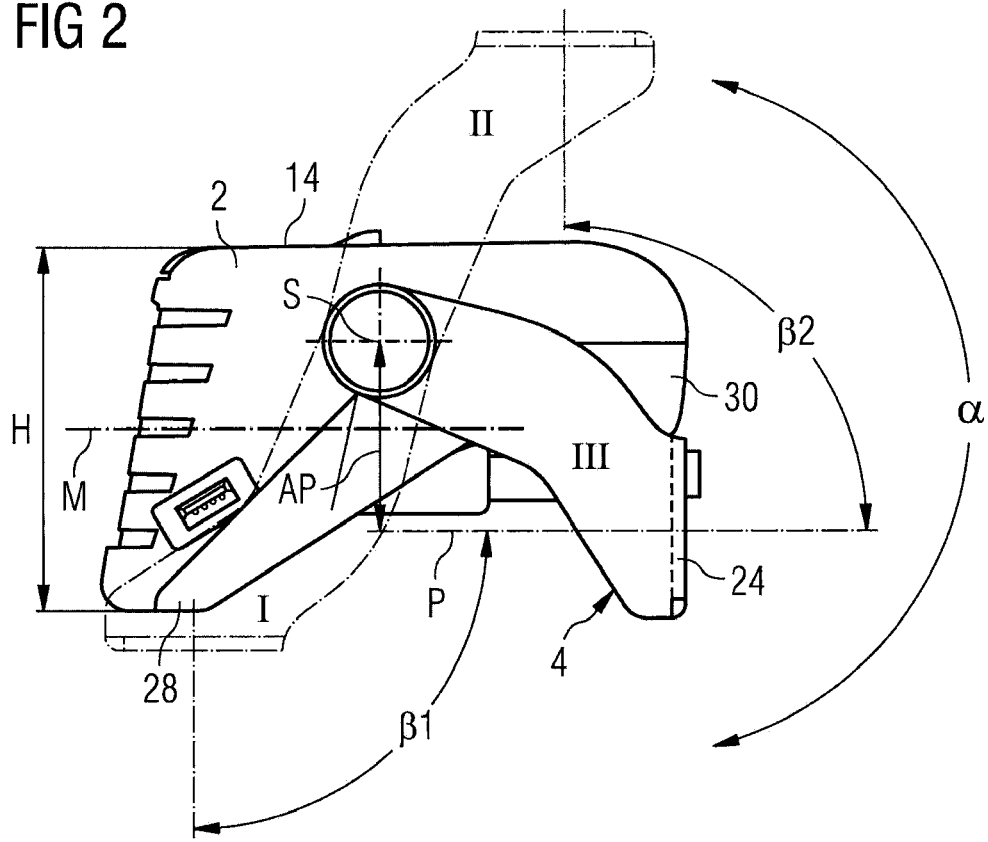
FIGS. 2, 3 are side views of the vehicle data recording device from FIG. 1.
Figure 3:
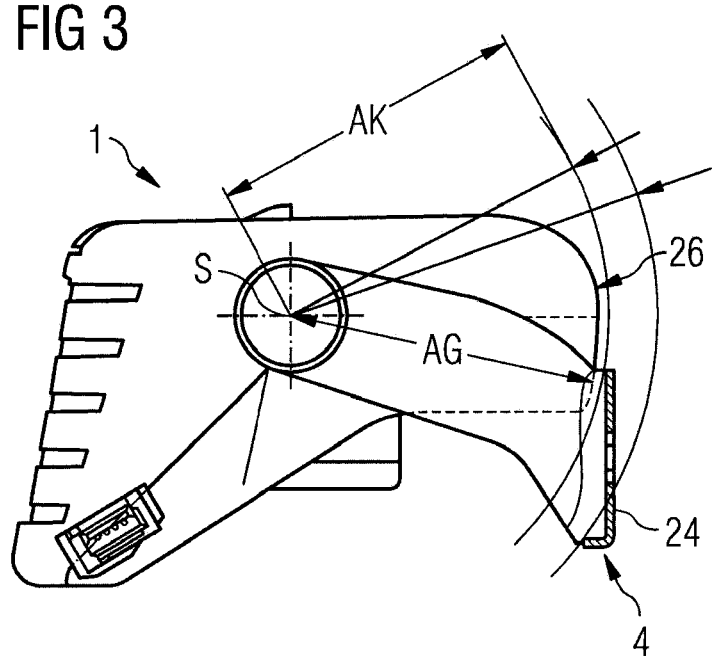

In the side view according to FIGS. 2 and 3, the pivoting axis S is arranged above a housing central axis M with respect to the height H of the housing 2. In addition, the smallest distance AK between the pivoting axis S and the mounting plate of the supporting bracket 4 is larger than the largest distance AG between the pivoting axis S and a rear side housing wall 26 of the housing 2, so that the supporting bracket 4 can be pivoted through an angle α of 180° over a housing rear side 30 of the housing 2, between a first position I in a region underneath a housing lower side 28 and a second position II in a region above the housing upper side 14.

Within a customary tolerance range, the angle α can also deviate from the specified value 180°; in particular, the angle a could, also, be significantly larger than 180°.

The rear-side housing wall 26 has the housing rear side 30 and can, furthermore, also comprise further housing sections.

The supporting bracket 4 is respectively indicated by dash-dot line in the specified positions I and II in FIG. 2 in order to clarify the pivotability. The first-mentioned position I, in which the mounting plate 24 is oriented horizontally, permits, for example, installation of the vehicle data recording device 1 on a dashboard of the motor vehicle; and the second-mentioned position II in which the mounting plate 24 is also oriented horizontally permits, for example, the vehicle data recording device 1 to be suspended from a roof of a driver's cab of the motor vehicle. In a further position III, in which the supporting bracket 4 is shown by a continuous line in FIG. 2, the mounting plate 24 is arranged vertically. In position III of the supporting bracket 4 installation of the vehicle data recording device 1 in front of a dashboard of the motor vehicle is made possible. Starting from the last-mentioned position III of the supporting bracket 4, two component pivoting angles 131, 132, which each comprise 90° here, are shown with respect to the positions I and II mentioned further above, in FIG. 2 for the purpose of illustration. Between these above-mentioned positions I and II, the mounting plate 24 can be mounted at any desired inclined plane in the motor vehicle.

It is also to be noted that the distance AP between a plate central axis P, which intersects a mounting face of the mounting plate 24 perpendicularly, and the pivoting axis S is larger than zero. The specified distance AP is approximately as large here as the width of the mounting plate 24 in the transverse direction with respect to the pivoting axis.

Figure 4:
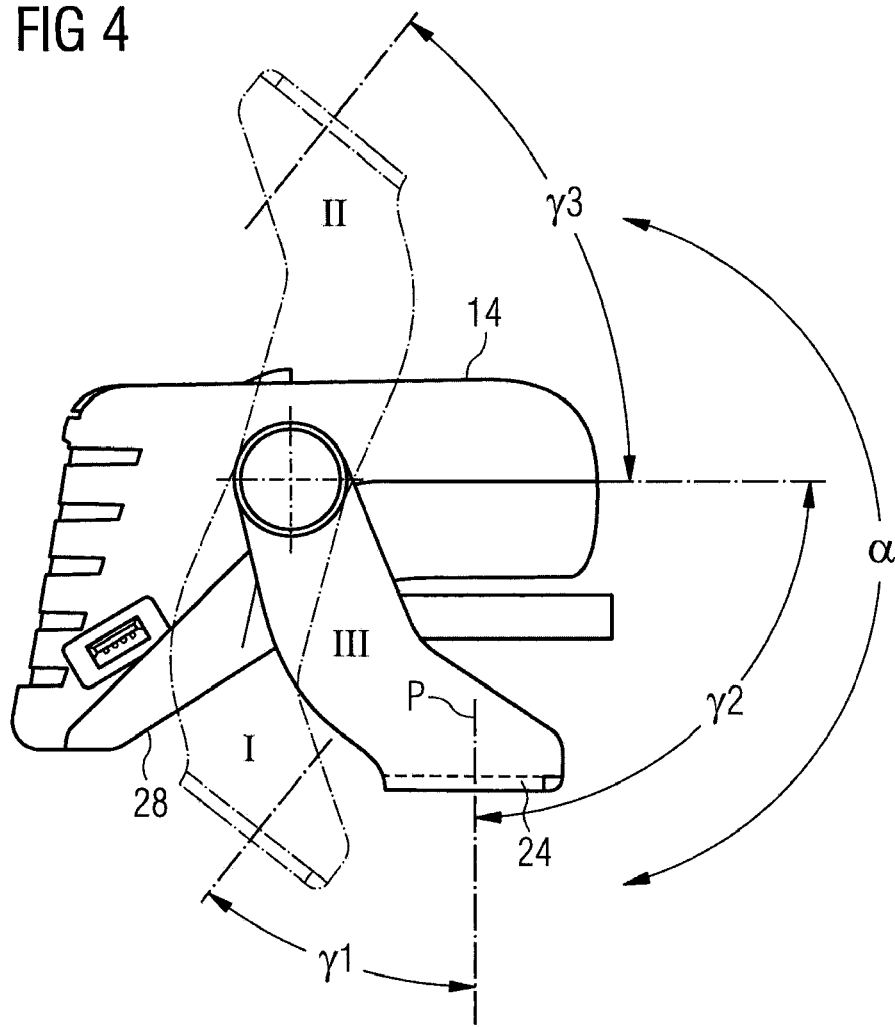
FIGS. 4, 5 is a side view of the vehicle data recording device from FIG. 1.
Figure 5:
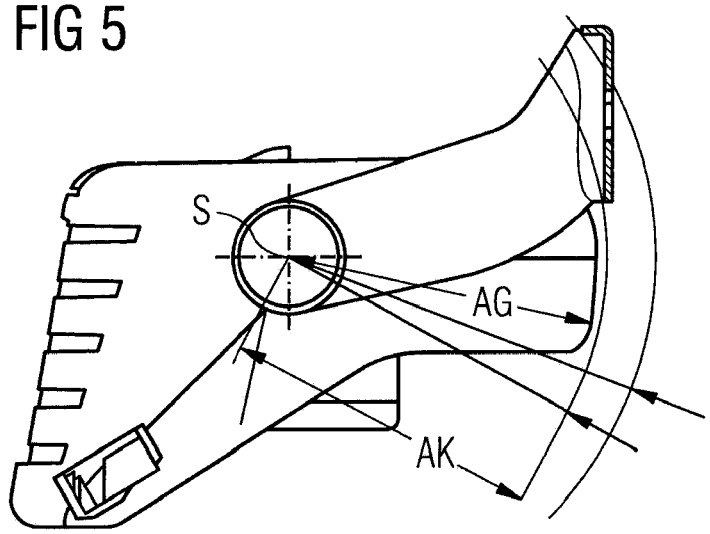

In another variant of the vehicle data recording device 1 according to FIG. 1, which is shown in side views in FIGS. 4 and 5, the supporting bracket 4 is connected to the housing 2 in an arrangement in which it is rotated through 180° about the plate central axis P. Depending on the arrangement of the supporting bracket 4 with respect to the housing 2, the mounting plate 24 can therefore be offset in forward or rearward direction. This provides additional possible positional arrangements of the vehicle data recording device 1 in the motor vehicle.

In FIG. 4, the supporting bracket 4 is shown in a central position III with a continuous line. In position III, the mounting plate 24 is arranged horizontally. In order to clarify the pivotability of the supporting bracket 4, the supporting bracket 4 is also shown in FIG. 4 in a first position I in a region underneath the housing lower side 28 and in a second position II in a region above the housing upper side 14, in each case by dash-dot lines. A component pivoting angle γ1 of 38° is present between the central position III and the first position I, and between the central position III and the second position II there is an angle composed of two component pivoting angles γ2, γ3 of 90° and 52°.

Figure 6:
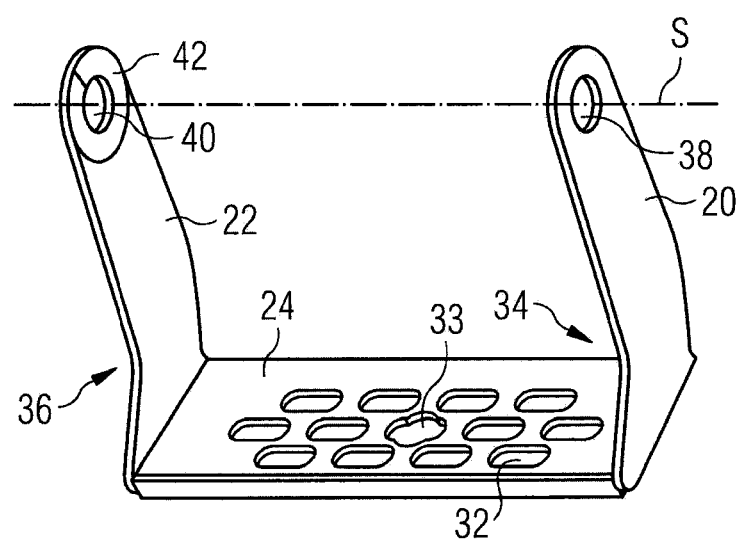
FIG. 6 is a perspective view of a supporting bracket of the vehicle data recording device from FIG. 1.

In FIG. 6, the supporting bracket 4 of the vehicle data recording device 1 according to FIG. 1 is illustrated individually. The mounting plate 24 has, in its mounting face, a plurality of mounting cutouts 32 which are arranged in at least two parallel rows. In this embodiment, the mounting cutouts 32 are embodied as elongate holes. In addition, a circular cutout 33 is provided centrally in the mounting plate 24.

A connecting cable for the vehicle data recording device 1 can be laid through this cutout 33, and therefore an opening which is necessary for feeding through the connecting cable in a passenger compartment trim of the motor vehicle, for example a dashboard or what is referred to as an inner roof lining, can be concealed.

The supporting limbs 20, 22 are of planar design and the first supporting limb 20 has, in its supporting limb plane, a bent portion 34 starting from the pivoting axis S. The second supporting limb 22 has a bent portion 36 which corresponds to the bent portion 34 of the first supporting limb 20, with the result that the supporting limbs 34, 36 run in parallel. In the exemplary embodiment shown here, the supporting limbs 20, 22 have a curved shape by virtue of the bent portions 34, 36.

In the region of the screwed connections 23, 25 (see FIG. 1), the supporting limbs 20, 22 have cutouts 38, 40. As can be seen only at the cutout 40 of the second supporting limb 22 because of the perspective illustration, the supporting limbs 20, 22 have, at their limb surface facing the housing 2 (see FIG. 1), supporting limb latching elements 42 which are arranged radially around the pivoting axis S.

In the region of the screwed connections 23, 25 (see FIG. 1), the supporting limbs 20, 22 have cutouts 38, 40. As can be seen only at the cutout 40 of the second supporting limb 22 because of the perspective illustration, the supporting limbs 20, 22 have, at their limb surface facing the housing 2 (see FIG. 1), supporting limb latching elements 42 which are arranged radially around the pivoting axis S.

The invention claimed is:

1. A vehicle data recording device (1) comprising:
   a housing (2), having a housing front side (6) which faces a user and has an operator control element (8), and a housing upper side (14) which has an access to a printing material receptacle (18) of a printing device; and
   a U-shaped supporting bracket (4) for mounting the housing (2) in a motor vehicle,
   wherein the housing (2) is pivotally connected to both a first supporting limb (20) and a second supporting limb (22) of the supporting bracket (4) in such a way that it can pivot about a pivoting axis (S),
   wherein the pivoting axis (S) is arranged above a housing central axis (M) with respect to the height (H) of the housing (2), and
   wherein the smallest distance (AK) between the pivoting axis (S) and a mounting plate (24), connecting the supporting limb (20, 22), of the supporting bracket (4) is larger than the largest distance (AG) between the pivoting axis (S) and a rear-side housing wall (26) of the housing (2), with the result that when the housing is pivotally connected to the supporting bracket, the supporting bracket (4) can be pivoted through an angle (α) of 180° over a housing rear side (30), between a first position (I) in a region underneath a housing lower side (28) and a second position (II) in a region above the housing upper side (14).

2. The vehicle data recording device as claimed in claim 1, characterized in that the distance (AP) between a plate central axis (P) which intersects perpendicularly a mounting face of the mounting plate (24), and the pivoting axis (S) is larger than zero.

3. The vehicle data recording device as claimed in claim 1, characterized in that the supporting limbs (20, 22) are of planar design and are connected to the mounting plate (24) at an angle of 90°, in that the first supporting limb (20) has, in its supporting limb plane, a bent portion (34) starting from the pivoting axis (S) in the direction of the mounting plate (24), and in that the second supporting limb (22) has a bent portion (36) which corresponds to the bent portion (34) of the first supporting limb (20), with the result that the supporting limbs (20, 22) run in parallel.

4. The vehicle data recording device as claimed in claim 1, characterized in that the housing (2) is respectively connected by means of a screwed connection (23, 25) to the first supporting limb (20) and to the second supporting limb (22).

5. The vehicle data recording device as claimed in claim 4, characterized in that the supporting limbs (20, 22) have cutouts (38, 40) in the region of the screwed connections (23, 25), and in that the supporting limbs (20, 22) are respectively screwed to the housing (2) by means of a screw-in element (21, 27).

6. The vehicle data recording device as claimed in claim 4, characterized in that the housing (2) respectively has a screw nut element in the region of the screwed connections (23, 25).

7. The vehicle data recording device as claimed in claim 1, characterized in that the housing (2) has, on its outer side, housing latching elements which are arranged radially around the pivoting axis (S).

8. The vehicle data recording device as claimed in claim 7, characterized in that the housing (2) is screwed to both supporting limbs (20, 22), and in that the housing (2) has the housing latching elements on both screwed connections (23, 25) to the supporting limbs (20, 22).

9. The vehicle data recording device as claimed in claim 1, characterized in that at least one supporting limb (22) has, on its limb surface facing the housing (2), supporting limb latching elements (42) which are arranged radially around the pivoting axis (S).

10. The vehicle data recording device as claimed in claim 9, characterized in that the supporting limb latching elements (42) correspond to housing latching elements on the outside of the housing (2), with the result that the supporting limb latching elements (42) and the corresponding housing latching elements engage one in the other.

11. The vehicle data recording device as claimed in claim 1, characterized in that the mounting plate (24) has, in its mounting face, a plurality of mounting cutouts (32), wherein the mounting cutouts (32) are arranged in at least two parallel rows.

12. The vehicle data recording device as claimed in claim 1, characterized in that the mounting plate (24) has, in its mounting face, a cutout (33) for a cable feedthrough.

13. The vehicle data recording device as claimed in claim 1, characterized in that the operator control element (8) of the housing front side (6) has a touch-sensitive screen (10).

14. The vehicle data recording device as claimed in claim 1, characterized in that the supporting bracket (4) is formed from a plastic material.

15. The vehicle data recording device as claimed in claim 14, characterized in that the plastic material is a composite fiber material and has glass fibers.

* * * * *